US007151665B2

(12) United States Patent
Ino et al.

(10) Patent No.: US 7,151,665 B2
(45) Date of Patent: Dec. 19, 2006

(54) HOST INSTRUMENT, PACKAGE TO BE INSERTED INTO SAME, EXTERNAL STORAGE MEDIUM TO BE USED THEREFOR, AND METHOD FOR AUTHENTICATING PACKAGE TO BE INSERTED INTO HOST INSTRUMENT

(75) Inventors: Masanobu Ino, Tokyo (JP); Yoshiaki Furukoshi, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 303 days.

(21) Appl. No.: 10/795,264

(22) Filed: Mar. 9, 2004

(65) Prior Publication Data

US 2005/0052840 A1 Mar. 10, 2005

(30) Foreign Application Priority Data

Sep. 10, 2003 (JP) ............................ 2003-318531

(51) Int. Cl.
*G06F 1/16* (2006.01)
*H05K 7/00* (2006.01)

(52) U.S. Cl. ...................... 361/685; 455/568; 600/300; 365/63

(58) Field of Classification Search ........ 455/566–568; 365/63, 51; 361/679–687, 724–727, 735–737; 600/300
See application file for complete search history.

(56) References Cited

U.S. PATENT DOCUMENTS

| | | | | |
|---|---|---|---|---|
| 5,867,795 | A * | 2/1999 | Novis et al. | 455/566 |
| 6,175,517 | B1 * | 1/2001 | Jigour et al. | 365/63 |
| 6,704,204 | B1 * | 3/2004 | Eskildsen et al. | 361/737 |

FOREIGN PATENT DOCUMENTS

| | | |
|---|---|---|
| JP | 10-275037 A | 10/1998 |

* cited by examiner

*Primary Examiner*—Hung Van Duong
(74) *Attorney, Agent, or Firm*—Foley & Lardner LLP

(57) ABSTRACT

A method for authenticating a package to be insertable into and removed from a host instrument wherein an external storage medium for storing key information inherent to the package is inserted into the package or the host instrument, the key information is collated with key verification information which is stored in the package or the host instrument, and transmission of information is permitted only when the external storage medium is allowable.

20 Claims, 10 Drawing Sheets

FIG. 9

| | POSSIBLE/IMPOSSIBLE IN TRANSMISSION OF INFORMATION | |
|---|---|---|
| | IN CASE OF "YES" | IN CASE OF "NO" |
| KEY IS INSERTED | POSSIBLE | IMPOSSIBLE |
| KEY IS ALLOWABLE | POSSIBLE | IMPOSSIBLE |
| PRESENSE OF INFORMATION ON COMPLETION OF TRANSMISSION | POSSIBLE | IMPOSSIBLE |

FIG. 10

| | POSSIBLE/IMPOSSIBLE IN TRANSMISSION OF INFORMATION | |
|---|---|---|
| | IN CASE OF BEING IDENTIFIED | IN CASE OF BEING NOT IDENTIFIED |
| KEY SERIAL NUMBER | POSSIBLE | IMPOSSIBLE |
| PACKAGE SERIAL NUMBER | POSSIBLE | IMPOSSIBLE |
| NAME OF PACKAGE MANUFACTURER | POSSIBLE | IMPOSSIBLE |
| HOST SERIAL NUMBER | POSSIBLE | IMPOSSIBLE |
| PORT NUMBER | | |
| RANGE OF TRANSMISSION RATE | POSSIBLE | IMPOSSIBLE |
| SECRET CODE FOR UPDATING | | |
| IP ADRESS | POSSIBLE | IMPOSSIBLE |

HOST INSTRUMENT, PACKAGE TO BE INSERTED INTO SAME, EXTERNAL STORAGE MEDIUM TO BE USED THEREFOR, AND METHOD FOR AUTHENTICATING PACKAGE TO BE INSERTED INTO HOST INSTRUMENT

The present application is based on Japanese patent application No. 2003-318531, the entire contents of which are incorporated herein by reference.

BACKGROUND OF THE INVENTION

1. Field of the Invention

This invention relates to a system for processing information by inserting a package into a host instrument, and more particularly to a method for authenticating to avoid the unfair use of a package, and a host instrument, a package, and an external storage medium to be, respectively, used in the authenticating method.

2. Description of the Related Art

A transceiver which is served for optical communication (which means only mutual conversion of optical signals and electrical signals in a narrow sense, while it involves also protocol processing in a lower hierarchy in a broad sense) is integrated into a host instrument which performs optical communication through connection of optical fiber. In this case, the transceiver is not inserted into the host instrument in a fixed manner, but a window has been previously defined in the host instrument, and the transceiver is inserted into the window, whereby the transceiver is in ready for application. According to such arrangement, transceivers can be optionally exchanged dependent upon troubles in transceivers, and differences or changes in various communicating specifications.

The inside of a host instrument is provided with a container having an opening on either side thereof called by the name of “cage” for containing a transceiver therein which is inserted through a window, and further connection terminals for electrical connection (receiving side) are disposed on the innermost part of the cage. A transceiver is arranged in such that optical devices and electronic circuits required for light transmission and reception are contained in a substantially rectangular parallelepiped housing, and an end of the housing is provided with connection terminals for electrical connection (side to be inserted). Thus, when the transceiver is inserted into the cage through the window, both the connection terminals are electrically connected with each other, whereby it becomes possible to transmit information between the host instrument and the transceiver.

As described above, a member is arranged such that electronic circuits are contained in a housing, and the whole housing may be incorporated in a host instrument. This member is called generally by the name of “package”.

In recent years, such a package being capable of hot swapping in which the package is detachable without accompanying any inappropriate or sudden electric power application and short-circuit is supplied (see Japanese Patent Laid-open No. 10-275037).

Since a transceiver is an indispensable part for communication in a host instrument, it is supplied as an annexed part in the case of purchasing a host instrument. It is, however, supplied also as a replacement part to cope with the above-mentioned troubles and changes in specifications for communication.

As to such replacement parts, there are heretofore many cases where other makers manufacture and sell compatible parts. In this connection, packages supplied by a maker of manufacturing host instruments are called by the name of genuine parts, while packages supplied by the other makers are called by the name of compatible products.

In the case where a compatible product is, for example, a transceiver, there is such a tendency that although major specifications for communication such as optical wavelength, modulation techniques, light intensity, communication rate, and sign format are substantially satisfactory as in the case of a genuine product, there are some differences in details in such compatible products, or reliability is somewhat inferior in these products. For this reason, when a compatible product is applied, there is such a fear that operations of a host instrument which are assured by a maker of the host instrument cannot be attained. In an inferior compatible product, there is a case where an excessive burden of electric power is given to a host instrument or operations of the host instrument are adversely affected by excessive and unnecessary radiation. In this respect, a genuine product has, of course, the best affinity with respect to its host instrument, and further such genuine product clears legal or industry standards in a high level with respect to electric power consumption and unnecessary radiation, so that such genuine product can be used at ease. In this connection, a means or a way for restricting easy use of compatible products is desired.

On the other hand, when attention is paid on security problems, there are those of thefts and diversions. Since a package is detachable with respect to a host instrument, it is easily stolen, so that such package exhibits low security for user. When a package stolen is resold or diverted, advantages and confidence in a maker are unjustly damaged.

SUMMARY OF THE INVENTION

Accordingly, it is an object of the present invention to solve the above-described problems and to provide a method for authenticating to avoid the unfair use of a package, and a host instrument, a package, and an external storage medium to be, respectively, used in the authenticating method.

In order to achieve the above described object, a method for authenticating a package to be insertable into and removable from a host instrument according to the present invention comprises the steps of inserting in the package or the host instrument an external storage medium for storing key information inherent to the package, collating the key information with key verification information which is stored in the package or the host instrument, and permitting transmission of information only when the external storage medium is allowable.

In the method for authenticating the package according to the invention, the step of permitting transmission of information includes a step of maintaining the transmission of information even when the external storage medium is removed from the package or the host instrument.

In the method for authenticating the package according to the invention, the step of permitting transmission of information includes a step of permitting transmission of information only when a former transmission of information is normally completed, a completion of the former transmission of information being stored in the external storage medium.

In the method for authenticating the package according to the invention, the step of permitting transmission of information includes a step of permitting the transmission of information only when the key information is within a term of validity thereof, the key verification information including information for the term.

In the method for authenticating the package according to the invention, the package is a transceiver.

In the method for authenticating the package according to the invention, the step of permitting transmission of information includes a step of determining whether or not the external storage medium is correctly inserted into the package or the host instrument.

In the method for authenticating the package according to the invention, the step of determining whether or not the external storage medium is allowable includes a step for determining whether or not the external storage medium contains an allowable key serial number.

In the method for authenticating the package according to the invention, the step of permitting transmission of information includes a step for determining whether or not the external storage medium contains an allowable package serial number.

In the method for authenticating the package according to the invention, the step of permitting transmission of information includes a step for determining whether or not the external storage medium contains an allowable name of package maker.

In the method for authenticating the package according to the invention, the step of permitting transmission of information includes a step for determining whether or not the external storage medium contains an allowable serial number of a host instrument.

In the method for authenticating the package according to the invention, the step of permitting transmission of information includes a step for determining whether or not the external storage medium contains information on an allowable range of transmission.

A host instrument according to the present invention comprises a window for inserting a package having connection terminals, connection terminals for electrically connecting with the connection terminals of the package, and a slot for inserting an external storage medium in which key information of the package is stored.

The host instrument according to the invention comprises further a storing section for storing key verification information.

A package to be inserted into a host instrument according to the present invention comprises a housing to be inserted into and removable from the host instrument, connection terminals to be electrically connected to connection terminals of the host instrument when the housing is inserted into the host instrument, and a slot for inserting an external storage medium in which key information of the package is stored into the housing.

The package according to the invention comprises further a storing section for storing key verification information.

An external storage medium according to the present invention comprises a circuit board to be inserted into and removed from a host instrument, the host instrument comprising a window for inserting a package having connection terminals, connection terminals for electrically connecting with the connection terminals of the package, and a slot for inserting the external storage medium in which key information of the package is stored, and a memory for storing at least key information of the package, the memory being mounted on the circuit board.

An external storage medium according to the present invention comprises a circuit board to be inserted into and removable from a package, the package comprising a housing to be inserted into and removed from a host instrument, connection terminals to be electrically connected to connection terminals of the host instrument when the housing is inserted into the host instrument, and a slot for inserting the external storage medium in which key information of the package is stored into the housing, and a memory for storing at least key information of the package, the memory being inserted on the circuit board.

The above-described invention provides an excellent advantage for avoiding unfair use of packages.

BRIEF DESCRIPTION OF THE DRAWINGS

The present invention will be explained in more detail in conjunction with appended drawings, wherein:

FIG. 9 is a table showing conditions for authentication in the present invention;

FIG. 10 is a table showing particulars for key information applied in the present invention;

DESCRIPTION OF THE PREFERRED EMBODIMENTS

A preferred embodiment of the present invention will be described in detail hereinafter by referring to the accompanying drawings.

Figure 1A:
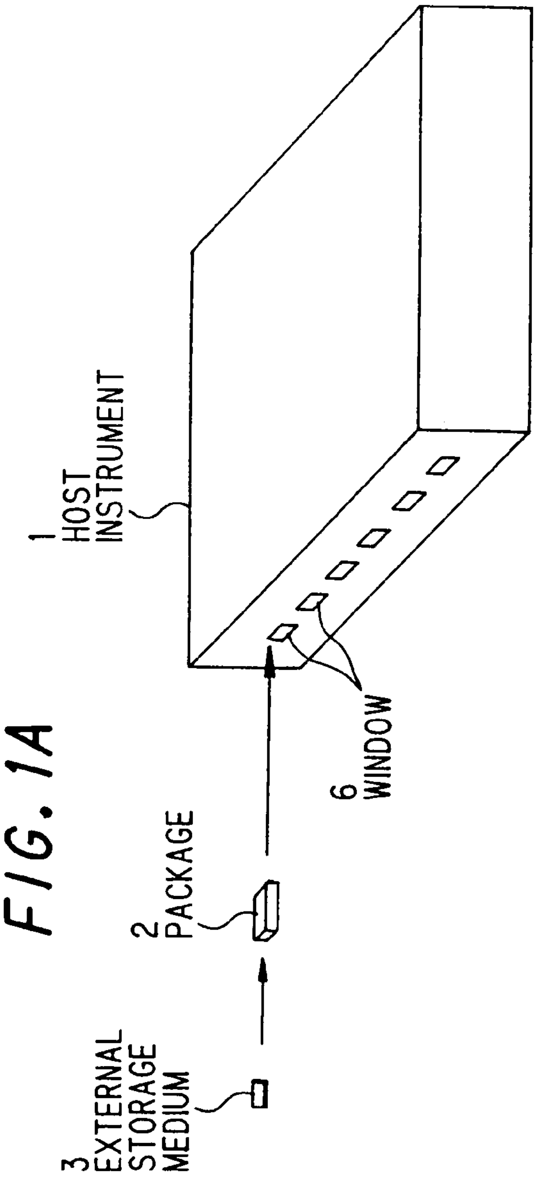
FIG. 1A is a constitutional view showing an embodiment of an optical communication system including a host instrument, a package, and an external storage medium according to the present invention.
Figure 1B:
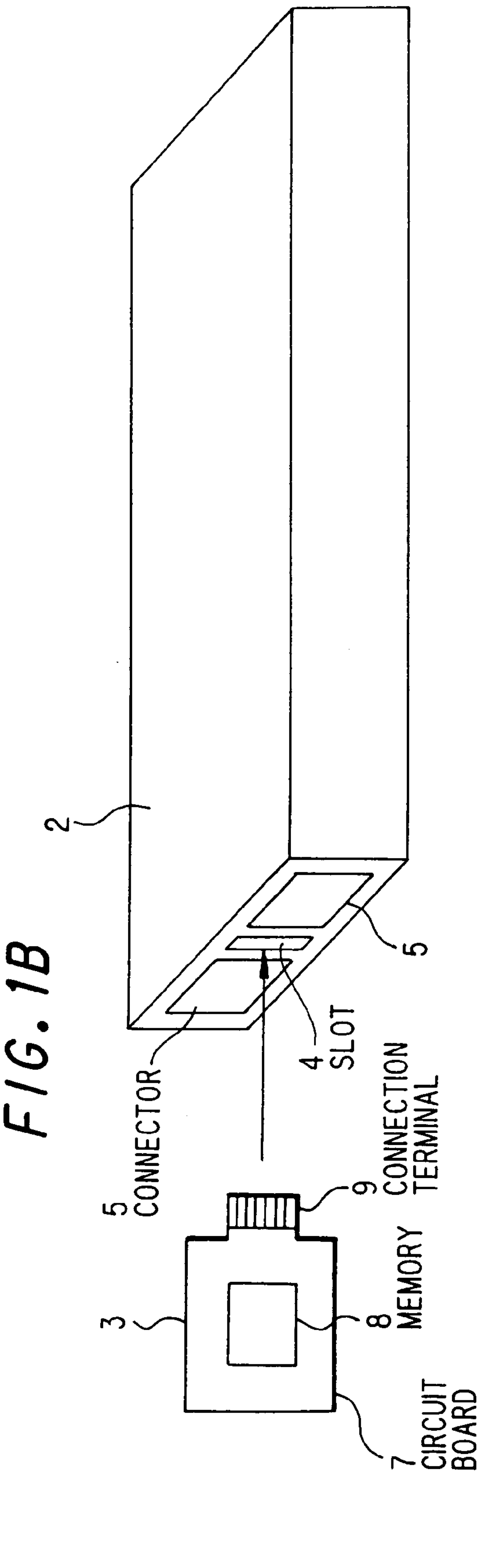
FIG. 1B is a constitutional view showing an embodiment of an optical communication system including a package, and an external storage medium according to the present invention.

As described in FIGS. 1A and 1B, an optical communication system for embodying a method for authenticating a package to be inserted into a host instrument according to the present invention is composed of the host instrument 1 served for a server or a relay device in a network; the package 2 being a transceiver which implements light transmission and reception in optical transmission line, and which is constituted so as to be insertable into and removable from the host instrument 1 and having a slot 4 for inserting an external storage medium 3 thereinto; and the external storage medium 3 storing key information which functions as a key for the transceiver by inserting it into the package 2.

A connector 5 is disposed on the package 2 for connecting with an optical fiber, and further a light transmission element and a light reception element (not shown) are housed therein, and connection terminals for the host instrument 1 (not shown) are placed on the package 2. In this case, it is preferred that the package 2 is capable of hot swapping with respect to the host instrument 1.

On one hand, a window 6 for inserting the package 2 is defined in the host instrument 1. A cage (not shown) is housed in the host instrument 1 so as to face with the window 6. Connection terminals (not shown) to the package 2 are disposed in the inner most part of the cage. A single window or a number of windows may be defined on the host instrument 1.

The external storage medium 3 is composed of a circuit board 7 provided with a memory 8 and connection terminals 9 thereon. As a matter of course, other connection terminals (not shown) capable of fitting with the connection terminals 9 are provided in the slot 4 of the package 2. The external storage medium 3 is preferably capable of hot-swapping with respect to the package 2. In a hot-swapping mode, it is desirable to apply such a mechanical structure that a power supply and a grounding line are connected before signal lines are connected as well as to apply an electrical or a software constitution which detects automatically connection of the signal lines.

Figure 2:
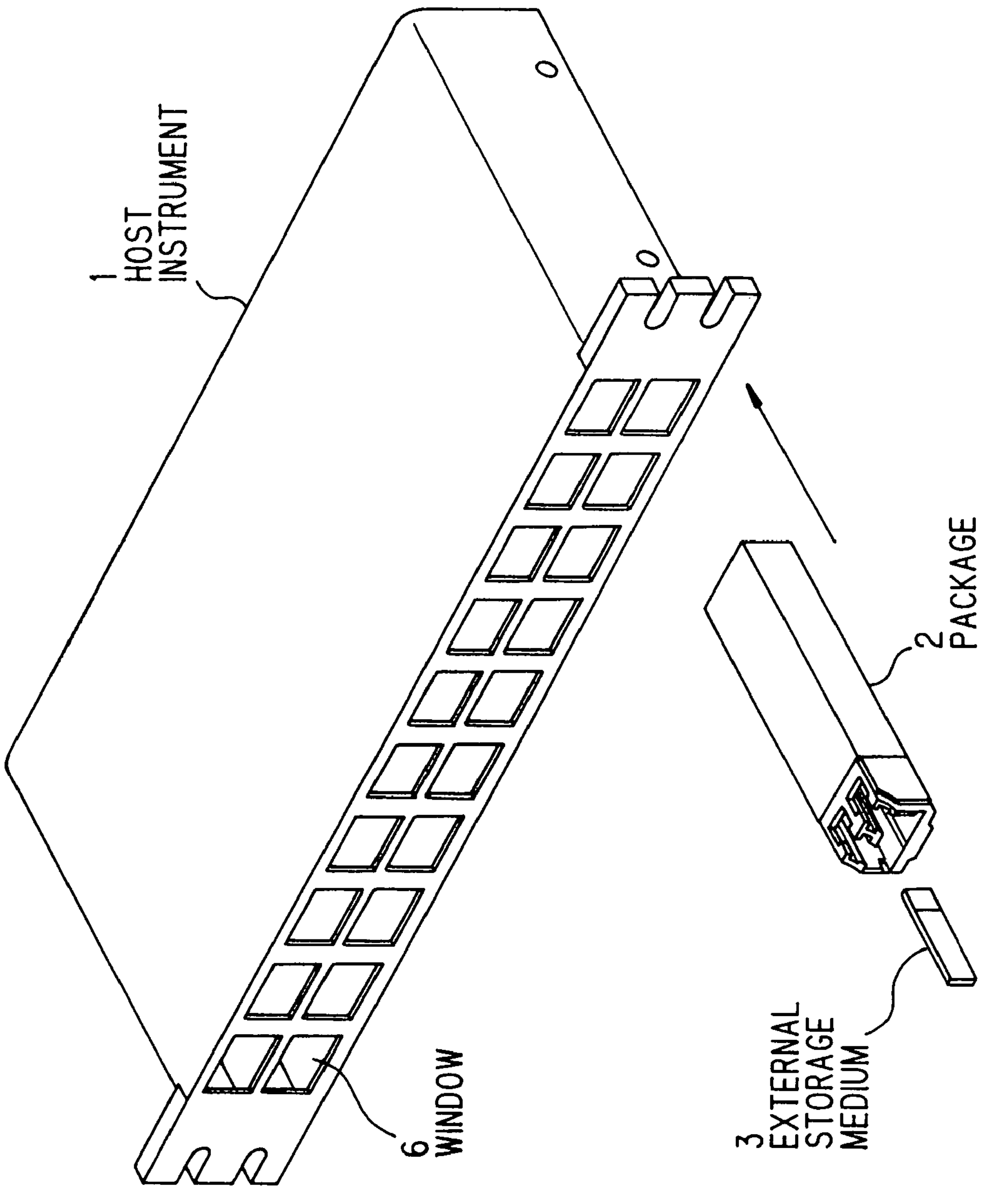
FIG. 2 is a perspective view showing enlarged components constituting an embodiment of the optical communicating system according to the present invention.

A specific constitution of the optical communication system is shown in FIG. 2 wherein a plurality of windows 6 are arrayed and defined on the host instrument 1 in horizontal and vertical directions. In this situation, an arbitrary number of packages 2 maybe inserted into arbitrary windows 6. Besides, an external storage medium 3 may be inserted into any of these packages 2.

Figure 3:
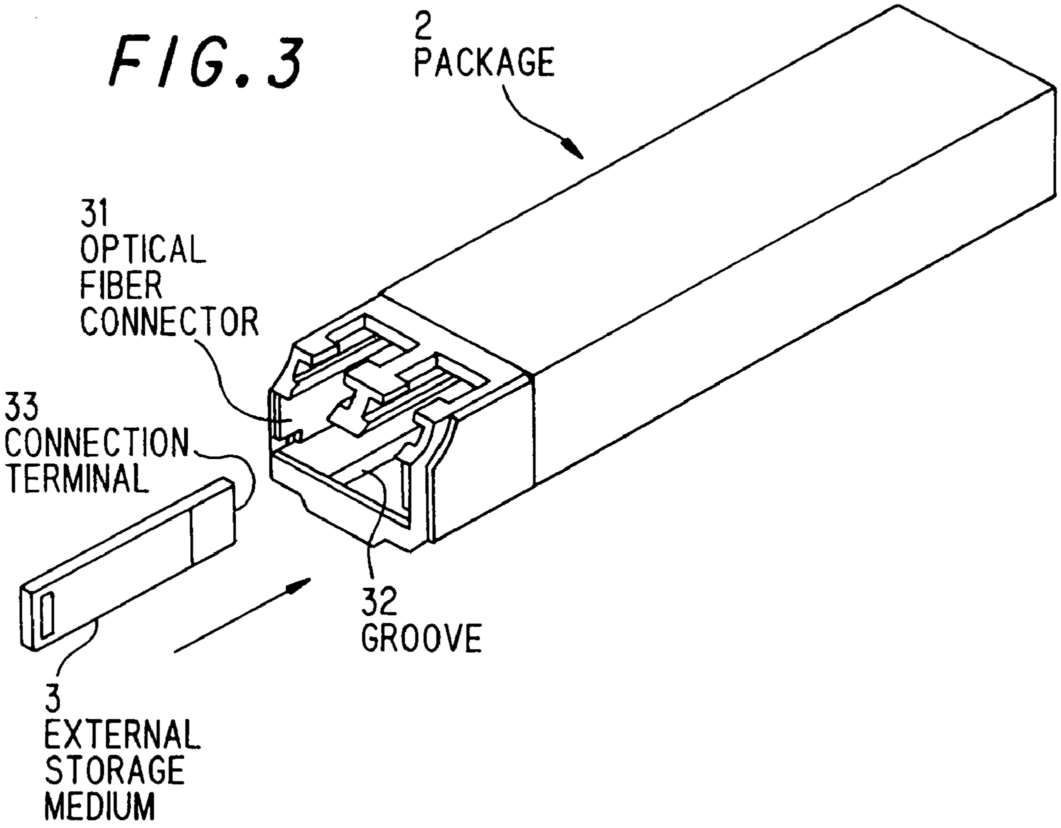
FIG. 3 is a perspective view showing an embodiment of a package used in the optical communicating system according to the present invention.

FIG. 3 is a perspective view showing an enlarged package 2 wherein since only a single optical fiber connector can be inserted into a single opening (see the connector 5 in FIG. 1B), two openings communicating with each other are defined on the package without providing a partition wall for the sake of inserting two single optical fiber connectors 31 or a twin optical fiber connector 31 thereinto. A groove 32 for guiding the external storage medium 3 is defined on an area where no partition wall is provided. The external storage medium 3 is formed in a substantially rectangular plate an end of which is provided with a connection terminal 33 of a card edge type. Another connection terminal (female type) (not shown) to be fit with the connection terminal 33 is disposed inside the package 2. Conversely, it may be arranged such that the external storage medium 3 is provided with a female connection terminal, while a male connection terminal is disposed inside the package 2. Contents of the signal in such a connection terminal are Vcc (power supply), GND, serial clock, serial data (two serial data), write protection and the like.

Figure 4:
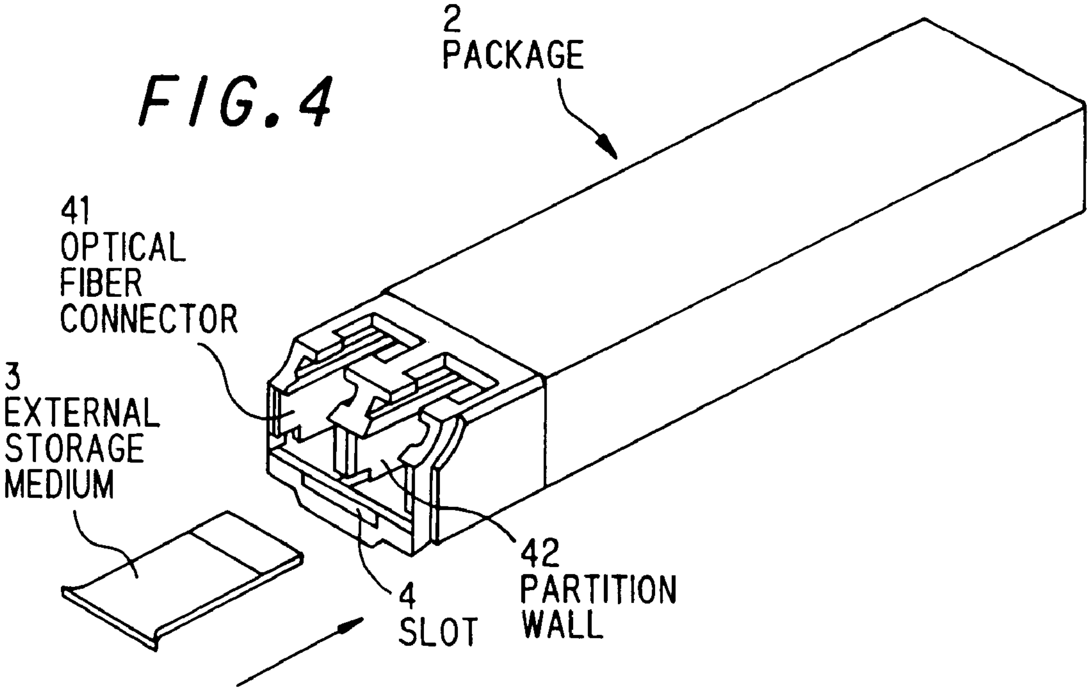
FIG. 4 is a perspective view showing another embodiment of a package used in the optical communicating system according to the present invention.

FIG. 4 is a perspective view showing an enlarged package 2 according to another embodiment of the invention wherein two openings into each of which a single optical fiber connector can be inserted are defined with a partition wall 42 placed between them in order to insert two single optical fiber connectors 41 or a twin optical fiber connector 41. Under the connectors 41, a horizontally extendings lot 4 is defined. An external storage medium 3 is inserted into the slot 4 along the horizontal direction of the package 2.

Figure 5:
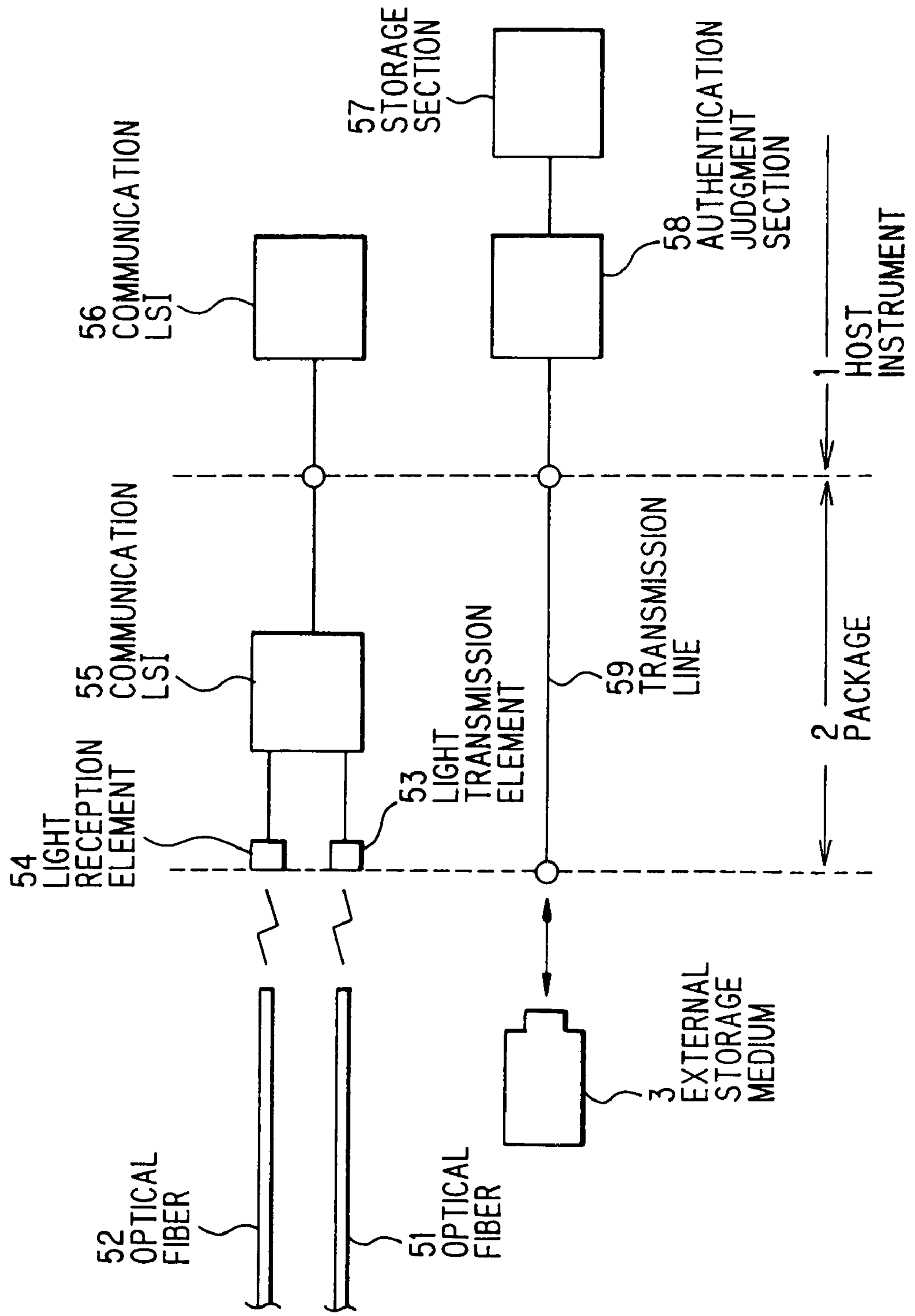
FIG. 5 is a circuit diagram showing an embodiment of the optical communicating system according to the present invention.

FIG. 5 is a circuit diagram illustrating a circuit for the optical communication system shown in FIGS. 1A and 1B. As shown in FIG. 5, the package 2 is provided with an light transmission element 53 connected (optically coupled) to an optical fiber 51, an light reception element 54 connected (optically coupled) to an optical fiber 52, and a communication LSI 55 for communicating with the host instrument 1 in such that communication processing such as code conversion is carried out. On one hand, the host instrument 1 is provided with a communication LSI 56 corresponding to the communication LSI 55.

The host instrument 1 has a storage section 57 for storing key verification information, and an authentication judgment section 58 for checking and comparing key information contained in the external storage medium 3 with the key verification information to permit transmission of information to the package 2 which is implemented by the communication LSI 56. The package 2 is provided with a transmission line 59 which communicates the external storage medium 3 with the authentication judgment section 58. Furthermore, it may be arranged such that the host instrument 1 does not have the storage section 57 and the authentication judgment section 58, while the package 2 has these sections, and in this condition, transmission of information to the host instrument 1 which is implemented by the communication LSI 55 is permitted.

Figure 6:
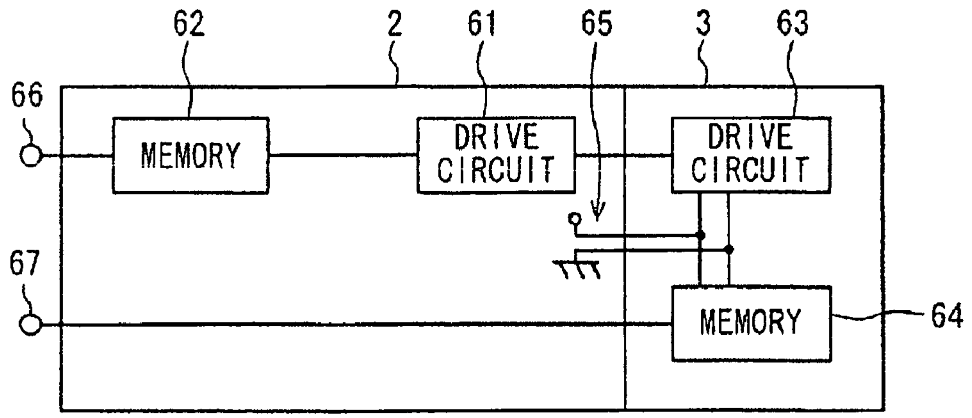
FIG. 6 is a circuit diagram showing a circuit used for authentication in an embodiment of the present invention.
Figure 7:
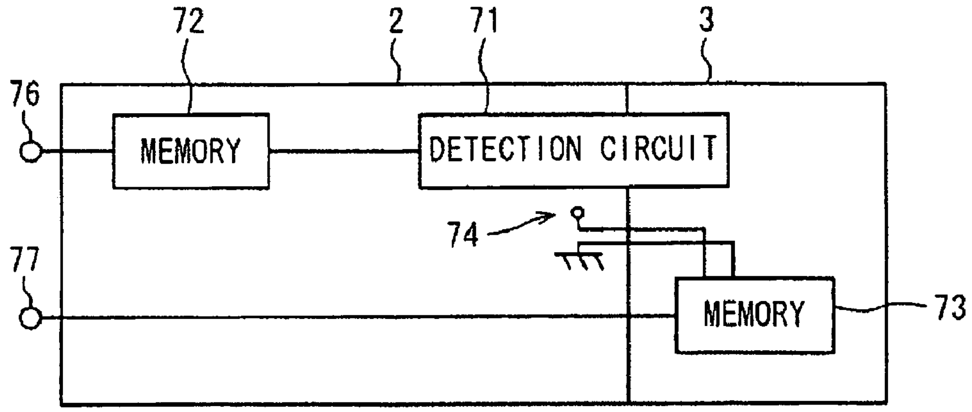
FIG. 7 is a circuit diagram showing a circuit used for authentication in another embodiment of the present invention.
Figure 8:
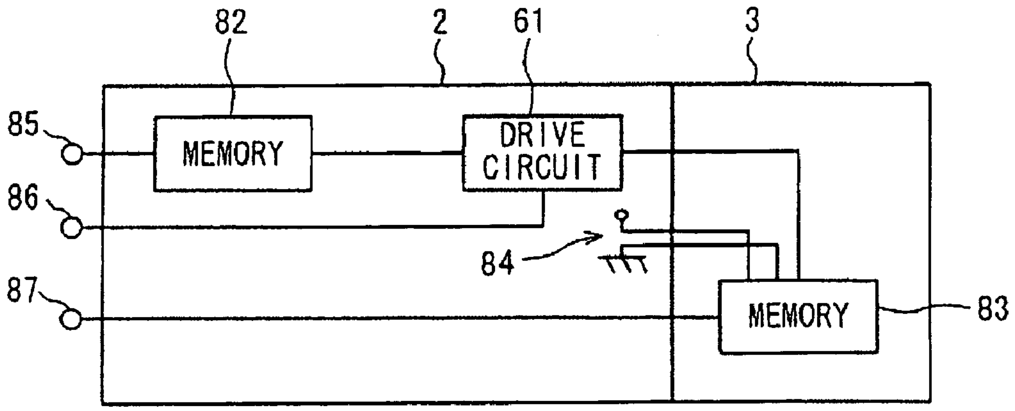
FIG. 8 is a circuit diagram showing a circuit used for authentication in a further embodiment of the present invention.

FIGS. 6 through 8 are circuit diagrams each illustrating another embodiment of the present invention wherein a circuit relating to optical communication is omitted, and further a host instrument 1 is also omitted.

As shown in FIG. 6, a package 2 contains a drive circuit 61 for effecting the starting action of the package 2 when a power supply is turned ON, and a memory 62 capable of switching rejection/permission of reading contents. On the other hand, an external storage medium 3 contains a drive circuit 63 for effecting the starting action of the external storage medium 3 when a power supply is turned ON, and a memory 64 for storing key information. It is arranged such that electric power for the external storage medium 3 is supplied from a power supply section 65 inside the package 2. An access line 66 to the memory 62 in the package 2 is connected to a host instrument (not shown). Moreover, an access line 67 to the memory 64 in the external storage medium 3 is connected to the host instrument through the package 2.

In a manner of FIG. 7, a (divided) detection circuit 71 riding on a package 2 and an external storage medium 3 is constituted. The package 2 contains a memory 72 for storing a detection status. The external storage medium 3 contains a memory 73 for storing key information. Electric power for the memory 73 is supplied from a power supply section 74 in the package 2. An access line 76 to the memory 72 of the package 2 is connected to a host instrument (not shown). On one hand, an access line 77 to the memory 73 of the external storage medium 3 is connected to the host instrument through the package 2.

In a manner shown in FIG. 8, a package 2 contains a microcomputer 81 capable of communicating with a host instrument (not shown) and accessing a memory 83 in an external storage medium 3, and a memory 82 for storing key information. Electric power for the memory 83 is adapted to be supplied from a power supply section 84 in the package 2. An access line 85 to the memory 82 in the package 2 and a communication line 86 to the microcomputer 81 are connected to the host instrument (not shown). Furthermore, an access line 87 to the memory 83 of the external storage medium 3 is connected to the host instrument thorough the package 2.

FIG. 9 is a table showing the conditions for authentication used for an authentication judgment section 58. As shown in the table, the conditions for authentication reside in the following three points. Namely, point 1 is whether or not a key (external storage medium) is inserted into a package 2, point 2 is whether or not the key is allowable, and point 3 is whether or not there is information representing that a former transmission of information is normally completed. As to the insertion of key, the authentication judgment section 58 judges Yes/No on the basis of a signal indicating the presence of the external storage medium 3. Further, Yes/No relating to allowability of the key is judged on the basis of the particulars shown in FIG. 10 which will be mentioned later. Particulars of the information representing a former transmission of information is normally completed will be also mentioned later. In the table shown in FIG. 9, transmission of information is permitted when all the conditions are "Yes", while transmission of information is not permitted when any of conditions is "No". It is to be noted that items of the authentication condition are not limited to the above-described three points, but other items maybe included. Besides, all the above-described three points need not necessarily be applied.

The authentication judgment section 58 permits transmission of information between a host instrument and a package only when all the above-described three points are "Yes". Accordingly, transmission of information is not permitted when no key is inserted, or when a key is not allowable even if the key is inserted, or other like occasions.

FIG. 10 is a table wherein particulars of key information are indicated. In the table a key serial number means a manufacturer's serial number assigned to an individual external storage medium 3 at the time of manufacturing it, so that it means an ID number for identifying an individual external storage medium 3. A package serial number means a manufacturer's serial number assigned to an individual package 2 at the time of manufacturing it, so that it means an ID number for identifying an individual package 2. In this case, either a common serial number may be assigned to a set of an external storage medium 3 and a package 2, or different serial numbers which have one-to-one correspondence may be assigned to a set of the external storage medium 3 and the package 2, respectively, at the time of vending them. A name of maker means a number for identifying a specific maker by which a package 2 has been manufactured. A host serial number means a manufacturer's serial number assigned to an individual host instrument 1 at the time of manufacturing it, so that it means an ID number for identifying an individual host instrument 1. A port number means a numeral designating an individual port (window 6) in the host instrument 1. A range of transmission rate means a rage within which a package 2 can function in compliant with such transmission rate (including sign format). An updating secret code means a password for authenticating to update key information.

Concerning these particulars, permission or rejection is represented by "possible" or "impossible". Hence, it is judged that a key is allowable only when all the particulars relating to permission or rejection for transmission of information are possible (or particulars which have been previously set in the authentication judgment section 58 are possible, or all the judgment conditions for authentication requested by a host instrument 1 are possible). It is permitted to update key information only when an updating secret code is valid.

A manufacturing date of a package 2 or an external storage medium 3, a name of maker in a host instrument 1, and/or a password for operating the package 2 may be added to particulars of key information.

In the following, an algorithm based on which whether a key (external storage medium 3) is inserted into a package 2 or not will be described.

Figure 11:
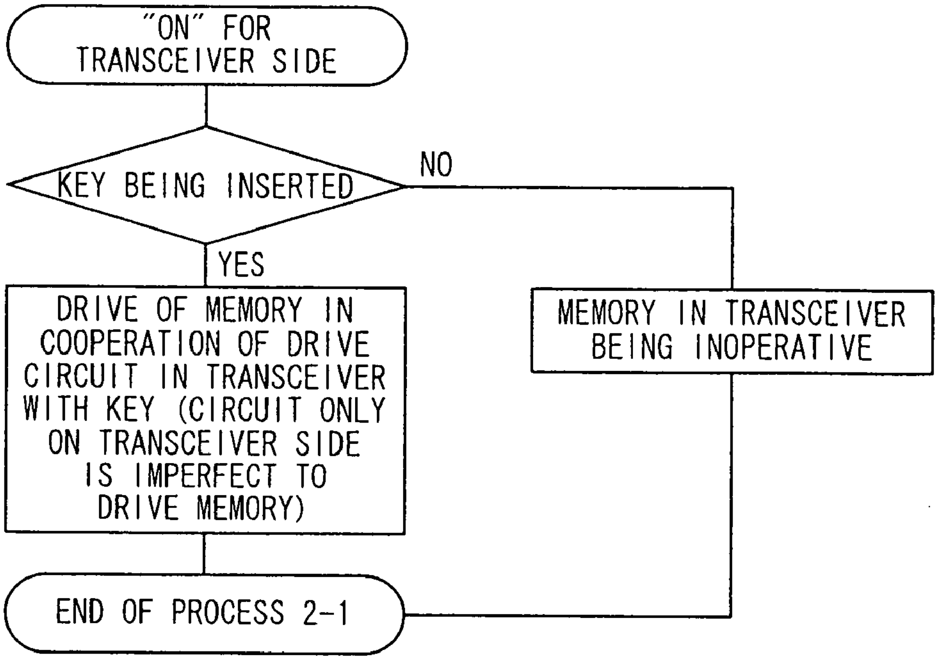
FIG. 11 is a flowchart illustrating an algorithm for judging presence of key in an embodiment of the present invention.

FIG. 11 is a flowchart illustrating an algorithm for judging the presence of a key which is suitable for applying to the hardware shown in FIG. 6 wherein the present algorithm is started with a condition where electric power is turned ON in a package 2 (which is called by the name of transceiver in FIG. 6), and then, different processing is executed in either case where a key is inserted into the package 2, or the case where no key is inserted into the package 2. More specifically, when a key is inserted, the drive circuit 61 operates together with the drive circuit 63 in FIG. 6 to start up the memory 62. On one hand, the memory 62 is not started up in such a situation where only the drive circuit 61 in the package 2 starts up, while the drive circuit 63 for the key does not startup. It is to be noted that the start-up of the memory 62 means the permission of reading a memory is such that the host instrument can read the memory 62 through the access line 66. In other words, when the key is not inserted, the drive circuit 63 for the key is in a state where it cannot be started up, so that the memory 62 does not start up (no operation in FIG. 6). Thus, it is rejected to read the memory 62 by means of the host instrument.

Figure 12:
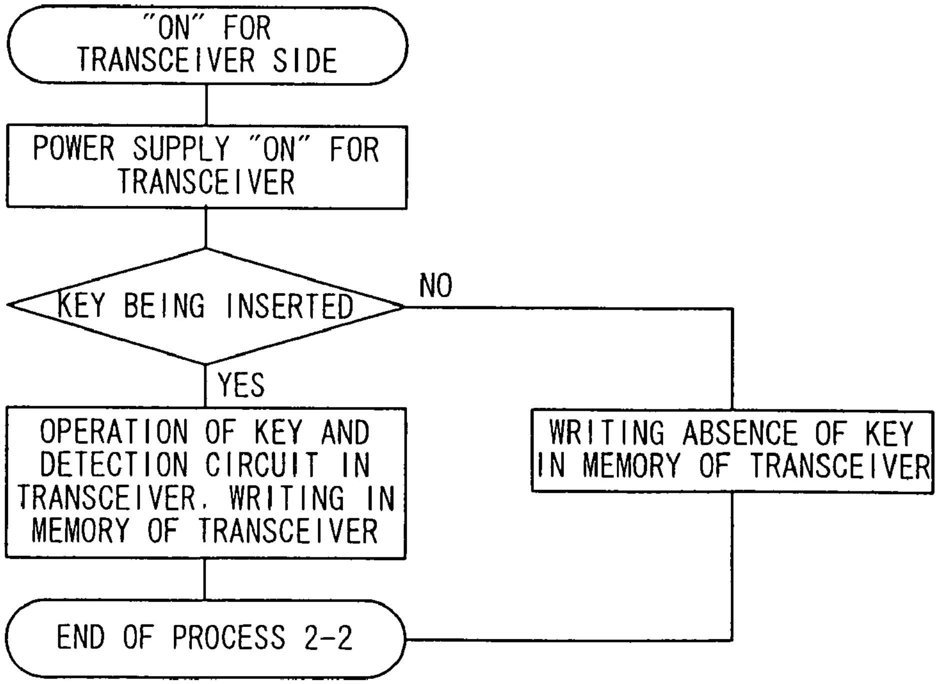
FIG. 12 is a flowchart illustrating another algorithm for judging presence of key in an embodiment of the present invention.

FIG. 12 is a flowchart illustrating an algorithm for judging presence of a key which is suitable for applying to hard wares shown in FIG. 7 wherein the present algorithm is started with a condition where electric power is turned ON in a package 2 (which is called by the name of transceiver in FIG. 7), and then, different processing is executed in either case where a key is inserted into the package 2, or the case where no key is inserted into the package 2. More specifically, when the key is inserted, the detection circuit 71 riding on the package 2 and the external storage medium 3 operates to write such detection status that there is a key in the memory 72. On the other hand, when no key is inserted, the detection circuit 71 divided by the package 2 operates to write into the memory 72 such detection status that there is no key.

Figure 13:
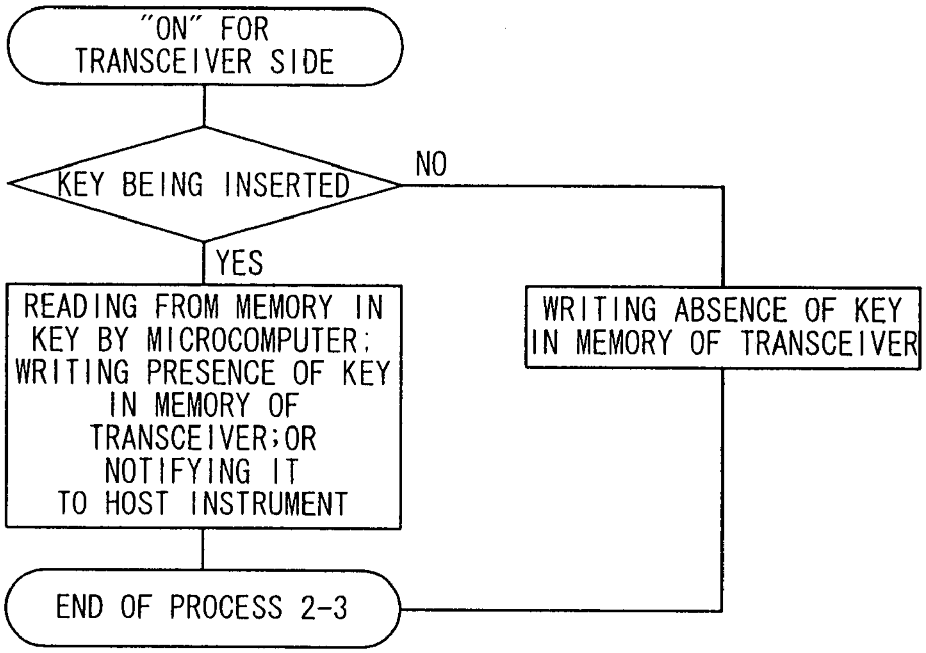
FIG. 13 is a flowchart illustrating a further algorithm for judging presence of key in an embodiment of the present invention.

FIG. 13 is a flowchart illustrating an algorithm for judging presence of a key which is suitable for applying to hard wares shown in FIG. 8 wherein the present algorithm is started with a condition where electric power is turned ON in a package 2 (which is called by the name of transceiver in FIG. 8), and then, different processing is executed in either case where a key is inserted into the package 2, or the case where no key is inserted into the package 2. More specifically, when the key is inserted, the microcomputer 81 reads the memory 83 in the key by means of a command from a host instrument, whereby it is recognized that there is a key based on the result read, and then, such key status that there is the key is stored in the memory 82, or such status is notified to the host instrument. When no key is inserted, the microcomputer 81 tries to read the memory 83 in the key, but it cannot read the memory 83, so that it is recognized that there is no key based on the result read, and then, such key status that there is no key is stored in the memory 82 by means of the microcomputer 81.

In the following, algorithm as to authentication in a host instrument will be described.

Figure 14:
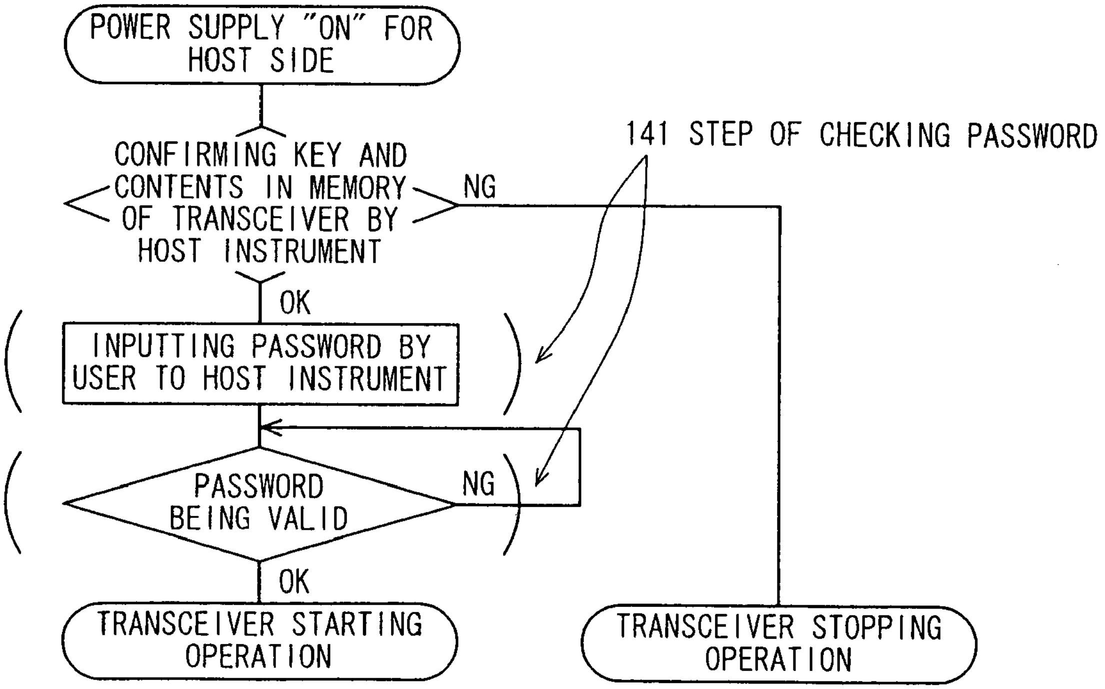
FIG. 14 is a flowchart illustrating an algorithm for authentication in a host instrument in an embodiment of the present invention.

As shown in the flowchart of FIG. 14, whenever the present algorithm is started with a condition where electric power is turned ON in a host instrument. The host instrument confirms the contents in the memories 64, 73, and 83, of a key as well as contents in the memories 62, 72, and 82 of a package 2 (which is called by the name of transceiver in FIG. 14). The term "confirmation" used herein means that rejection/permission for reading the memory 62, a detection status as to the presence of a key in the memory 72, and a key status in the memory 82 is read to judge whether or not the key is inserted, respectively, with respect to information from the package 2. It means to match the key information with the key verification information which has been involved previously in the host instrument with respect to the memories 64, 73, and 83 in the key.

After the confirmation, when the result obtained is "NG", in other words, where a key has not yet been inserted, or when key information is denied, operation of the package 2 (operation for optical communication) is stopped.

After the confirmation, when the result obtained is "OK", in other words, where a key has been inserted and when key information is verified, either operation of the package 2 (operation for optical communication) may be started at once, or such operation of the package 2 may be started after executing a step 141 for checking a password.

In the following, authentication operation for package in the optical communication system in FIGS. 1A and 1B will be described by referring to FIG. 15. Concerning hard wares, description is made by referring to FIGS. 1A, 1B and 5.

Figure 15:
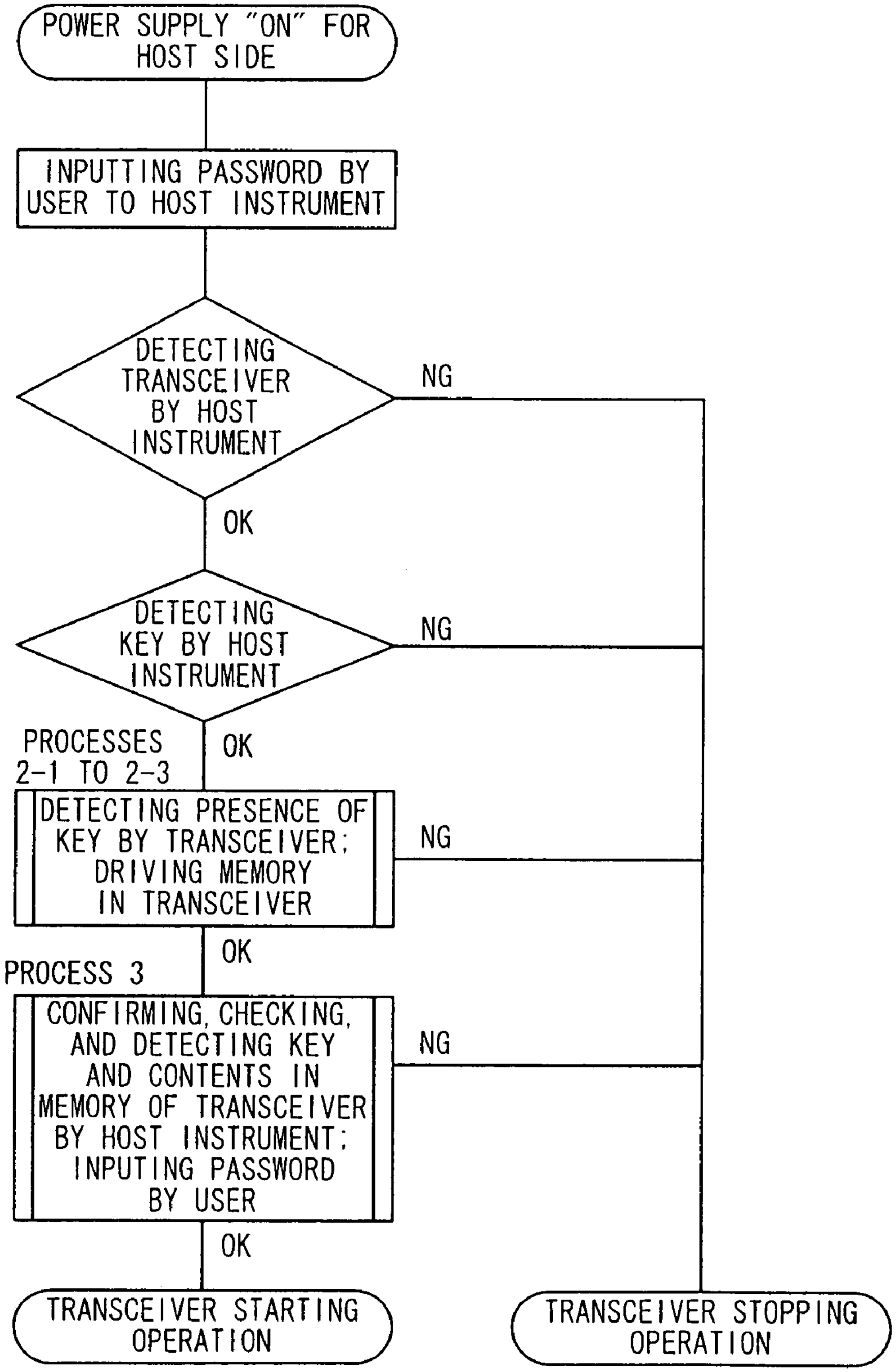
FIG. 15 is a flowchart illustrating an algorithm for authenticating operation of a package in an embodiment of the optical communicating system according to the present invention.

As shown in the flowchart of FIG. 15, it is supposed that a host instrument 1 which has been already energized and worked. In this condition, when a package 2 is inserted into the host instrument 1 through a window 6, an authentication judgment section 38 recognizes insertion of the package 2, since the package 2 is in hot swappable. When the package 2 (a transceiver in FIG. 15) is not detected, the result is "NG", so that operation of the package 2 (operation for optical communication) is stopped.

When detection of the package 2 is successfully achieved, the result is "OK". Then, the host instrument 1 checks whether or not a key (external storage medium 3) is inserted into the package 2 through a transmission line 59 in the package 2. When the key is not detected, the result is "NG", so that operation of the package 2 is stopped.

When the key is successfully detected, the result is "OK". Then, the package 2 detects presence of the key in accordance with any of the operations illustrated in FIGS. 11, 12, and 13, and either the package 2 starts up a memory, or such status is stored in a memory.

Furthermore, the host instrument 1 confirms the key and the package 2 in accordance with the operation mentioned previously with reference to FIG. 14, and operation of the package 2 (operation for optical communication) is stopped/started.

In accordance with the operations mentioned above, when an external storage medium 3 is not inserted into a package 2, an authentication judgment section 38 does not permit transmission of information. In other words, communication through an optical fiber is not started, even if such a package 2 which does not contain an external storage medium 3 is inserted into a host instrument. AS a matter of course, transmission of information is not permitted, even when such a type of package 2 with which an external storage medium 3 cannot fit well is inserted into a host instrument 1, When a package 2 contains already an external storage medium 3, or when an external storage medium 3 is inserted into a package 2 after the package 2 was inserted into a host instrument 1, an authentication judgment section 38 judges matching in key information with key verification information in a storing section 37. For the simplicity, it is supposed herein that the same contents as that of key information are set in the key verification information. In this case, the authentication judgment section 38 is sufficient to judge whether or not the contents of the key information is the same with that of the key verification information.

It is desirable, for example, that contents of key verification information to be set are notified from a maker of manufacturing host instruments 1 to another maker of manufacturing packages 2 together with external storage media 3, and the contents may be written in external storage media 3 in the package maker in accordance with the notification from the host instrument maker. Of course, such contents may be written in external storage media 3 in the host instrument maker, whereby contents which are allowed to match with details in a specification of the host instrument 1 can be established. For instance, if it is intended to avoid replaceable use of packages 2 in even a case where a host instrument 1 involves a plurality of windows (ports) into which packages 2 are to be inserted, and the packages 2 are in hot swappable, such problem is solved by applying an external storage medium 3 in which a port number is written previously as key verification information which is to be used for individual packages 2, respectively.

An authentication judgment section 38 does not permit transmission of information in the following cases. Namely, there are, for example, a case where a questioned package 2 is manufactured by a maker who has not been authorized to use in an appointed host instrument 1; a case where a key serial number does not coincide with a package serial number; and a case where a range for transmission rate specified in a host instrument 1 differs from that specified in a package 2 and an external storage medium 3. More specifically, communication through an optical fiber is not started, if an external storage medium 3 is not allowable in even a case when a package 2 containing the external storage medium 3 is inserted into a host instrument 1.

Since particulars to be judged can be set in an authentication judgment section 38, for example, such setting that all the matters in the particulars may be bypassed is also possible. In this case, even if all the particulars concerning key information are conflict with each other, transmission of information is permitted so far as an external storage medium 3 has been inserted into a package 2. Moreover, when names of manufacturer for packages 2 other than that of a manufacturer for a host instrument 1 is previously specified, in other words, even if a package 2 is a compatible product, it is possible to arrange in such that transmission of information is permitted so far as a package 2 is the one which is licensed by a maker for manufacturing host instruments 1.

An external storage medium 3 may be removed from a package 2 after information of transmission is permitted in accordance with the procedures mentioned above. In this case, even if the external storage medium 3 was removed, such permission for transmitting information is not canceled. Accordingly, communication with an optical fiber can be continued. It is desirable to hold the external storage medium 3 thus removed in a place different from that where a host instrument 1 is located. In this case, if a package 2 in this condition is stolen, the external storage medium 3 has been already removed from the package 2, so that there is no allowable external storage medium 3 in the package 2. Thus, it is impossible to use the package by inserting it into the other host instruments 1. It means that a package 2 which was stolen or sold over cannot be diverted to the other host instrument.

Before finishing use of a package 2, the authentication judgment section 38 makes up such information in which a former transmission of information is normally completed. The term "finish of use in package 2" means two cases, i.e. a case where a host instrument 1 is powered off, and a case where the host instrument 1 is not powered off, but a package 2 is picked out from the host instrument 1. In either case, the package 2 is finally powered off. In this connection, an operation indicating that a former transmission of information is normally completed should be made before the power is shut down. Such operation may be made by notifying the information to the host instrument 1 through a keyboard or a terminal, but in this case, an external storage medium 3 is utilized. More specifically, the external storage medium 3 which was removed from the package 2 and held previously is inserted again into the package 2. When a command for finishing processing is delivered from the host instrument 1 with the package 2 containing the external storage medium 3, the processing is finished. In this finish processing, information wherein use of a package is normally finished, in other words, a former transmission of information is also normally completed is made up, and such information is written in the external storage medium 3.

Thereafter, when the package 2 containing the external storage medium 3 is picked out from a window 6, the package 2 and the external storage medium 3 are powered off. In this case, however, information in which use of the package 2 is normally finished is kept in the external storage medium 3. When the package 2 is picked out before such operation for the above-described normal finish processing, the information in which a former transmission of information is normally completed is not written in the external storage medium 3. Although both the package 2 and the external storage medium 3 may be held together, separate holding of them enhances much more their security.

To restart use of the package 2, it is inserted into the host instrument 1, then, the authentication judgment section 38 checks presence and allowability of the external storage medium 3 as mentioned hereinabove, thereafter, it permits transmission of information. In this case, however, further judgment as to normal finish processing is made. Namely, when information in which a former transmission of information is normally completed is stored in the external storage medium 3, history to the effect that an operation of normal finish processing was made on the package 2 and the external storage medium 3 is proved. As a consequence, the authentication judgment section 38 permits transmission of information. When information of normal finish processing is not stored in an external storage medium 3, it is suspected that a package 2 or an external storage medium 3 is allowable or not allowable, so that the authentication judgment section 38 does not permit transmission of information.

There is such a case when a host instrument 1 is stopped during operating condition due to unexpected electricity failure, emergency stop and the like. In such a case, since an external storage medium 3 was already removed from a package 2 at work, operation of normal finish processing is not yet completed. Under the condition, when the host instrument 1 is operated again, it is judged inevitably that there is no information as to normal finish processing. As a countermeasure against such accident, information representing a term of validity for key information is allowed to include into key verification information in a storage section 37. Such information representing a term of validity for key information is adapted to be updated in each given term during operation. Hence, when the host instrument 1 is operated again, the authentication judgment section 38 does not check information of normal finish processing in an external storage medium 3, but checks a term of validity. Then, transmission of information is permitted only when the present time is within the term of validity. As a result, such a package 2 which was already permitted to transmit information can continuously transmit information when a host instrument 1 is operated again after unexpected electricity failure or emergency stop occur. Such term of validity may be appropriately set out in the host instrument 1.

As another way, there is also such a manner that a present time and a time limit were previously written in information representing a term of validity, and when powered on, the present time and the time limit written already are read out, and checked whether or not the present time is within the term of validity.

As described above, according to an optical communicating system to which the authentication method of the present invention is applied, only a package 2 which involves a valid key is permitted to execute communication, so that other compatible, stolen or diverted packages 2 can be excluded.

Figure 16:
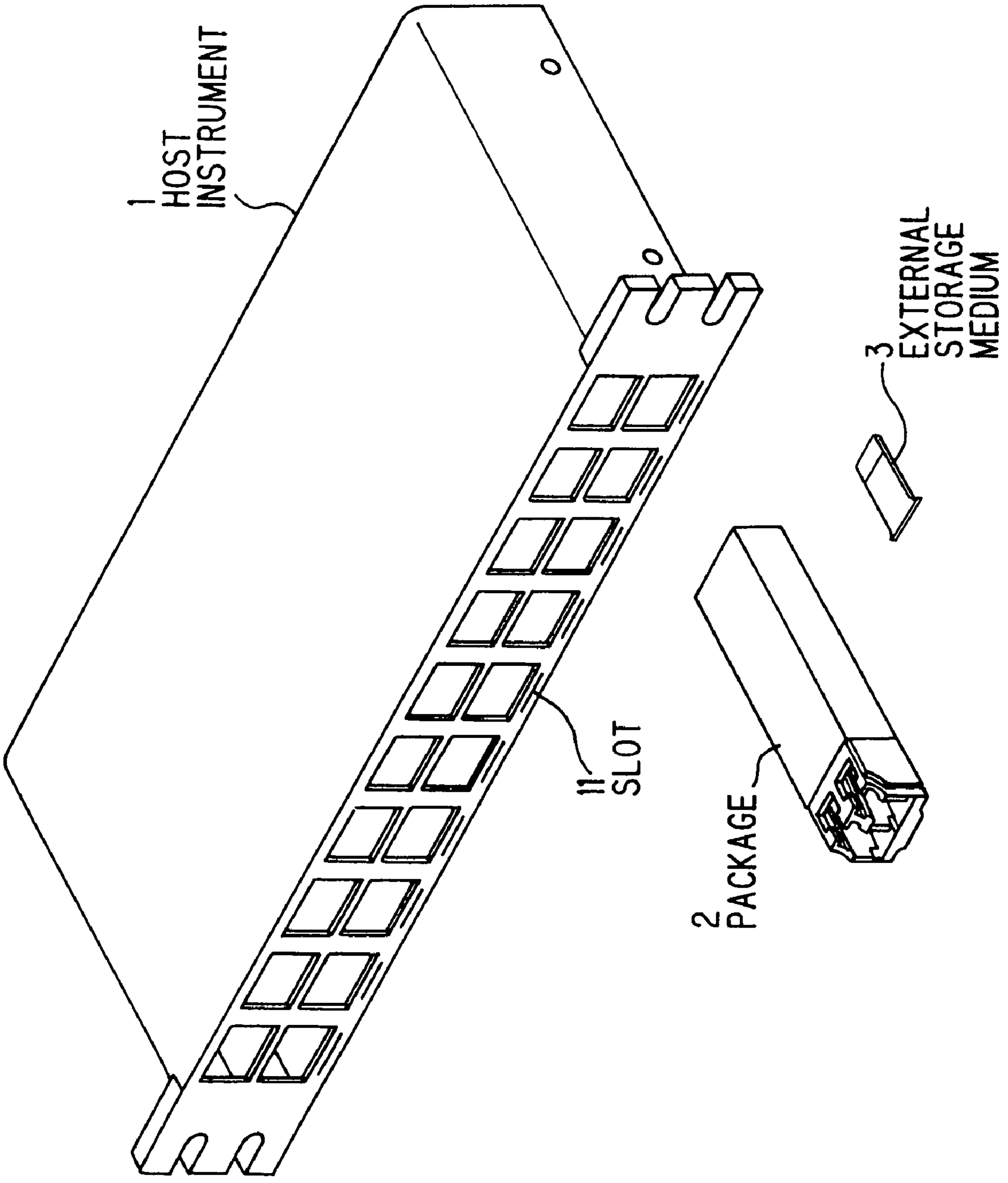
FIG. 16 is a perspective view showing enlarged components constituting another embodiment of the optical communicating system according to the present invention.

In the above-described embodiments, although it is arranged in such that a slot is defined on a package 2, and an external storage medium 3 is inserted into the package 2, the present invention is also applicable to such a modification that slots 11 are defined on a host instrument 1, as shown in FIG. 16, and an external storage medium 3 is allowed to contain in the host instrument 1 by inserting the external storage medium into the slot 11. In this case, the access 67 in FIG. 6, the access line 77 in FIG. 7, and the access line 87 in FIG. 8 become unnecessary, while a line for transmitting signals between the external storage medium 3 and a package 2 must be provided in the host instrument 1.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for authenticating a package to be insertable into and removable from a host instrument, comprising the steps of:

inserting in the package an external storage medium for storing an ID number inherent to the package, wherein the package is provided with an optical transmission and reception terminal at one end and an electric signal transmission and reception terminal at another end;

collating the ID number with key verification information which is stored in the package or the host instrument; and permitting transmission of information only when the external storage medium is allowable.

2. The method for authenticating the package as defined in claim 1, wherein:

the step of permitting transmission of information includes a step of maintaining the transmission of information even when the external storage medium is removed from the package or the host instrument.

3. The method for authenticating the package as defined in claim 1, wherein:

the step of permitting transmission of information includes a step of permitting transmission of information only when a former transmission of information is normally completed, a completion of the former transmission of information being stored in the external storage medium.

4. The method for authenticating the package as defined in claim 1, wherein:

the step of permitting transmission of information includes a step of permitting the transmission of information only when the ID number is within a term of validity thereof, the key verification information including information for the term.

5. The method for authenticating the package as defined in claim 1, wherein:

the package is a transceiver.

6. The method for authenticating the package as defined in claim 1, wherein:

the step of permitting transmission of information includes a step of determining whether or not the external storage medium is correctly inserted into the package.

7. The method for authenticating the package as defined in claim 1, wherein:

the step of determining whether or not the external storage medium is allowable includes a step for determining whether or not the external storage medium contains an allowable key serial number.

8. The method for authenticating the package as defined in claim 1, wherein:

the step of permitting transmission of information includes a step for determining whether or not the external storage medium contains an allowable package serial number.

9. The method for authenticating the package as defined in claim 1, wherein:

the step of permitting transmission of information includes a step for determining whether or not the external storage medium contains an allowable name of a package maker.

10. The method for authenticating the package as defined in claim 1, wherein:

the step of permitting transmission of information includes a step for determining whether or not the external storage medium contains an allowable serial number of a host instrument.

11. The method for authenticating the package as defined in claim 1, wherein:

the step of permitting transmission of information includes a step for determining whether or not the external storage medium contains information on an allowable range of transmission.

12. The method for authenticating the package as defined in claim 1, wherein:

the host instrument communicates with a plurality of packages accommodated in the host instrument and controls communications of respective packages.

13. A host instrument comprising:

a window for inserting a package having connection terminals;

connection terminals for electrically connecting with the connection terminals of the package; and a slot for inserting an external storage medium in which key information of the package is stored; and a judgment section for analyzing the key information of the package.

14. The host instrument as defined in claim 13, further comprising:

a storing section for storing key verification information.

15. The host instrument as defined in claim 13, wherein:

the host instrument is configured to communicate with a plurality of packages accommodated in the host instrument and controls communications of respective packages.

16. A package to be inserted into a host instrument, comprising:

a housing insertable into and removable from the host instrument;

connection terminals to be electrically connected to connection terminals of the host instrument when the housing is inserted into the host instrument; and a slot for inserting an external storage medium in which key information of the package is stored into the housing.

17. The package as defined in claim 16, further comprising:

a storing section for storing key verification information.

18. A system for processing information comprising:

a package having connection terminals;

a host instrument comprising a window for inserting the package, connection terminals for electrically connecting with the connection terminals of the package, and a slot for inserting an external storage medium in which key information of the package is stored; and the external storage medium comprising a circuit board for insertion into and removal from the host instrument and a memory for storing the key information of the package, wherein the memory is mounted on the circuit board.

19. A system for processing information comprising:

a host instrument with connection terminals, a package comprising a housing for insertion into and removal from the host instrument, connection terminals to be electrically connected to the connection terminals of the host instrument when the housing is inserted into the host instrument, and a slot for inserting an external storage medium in which key information of the package is stored into the housing; and the external storage medium comprising a circuit board for insertion into and removal from the package and a memory for storing the information of the package, wherein the memory is mounted on the circuit board.

20. A method for authenticating a package to be insertable into and removable from a host instrument, comprising the steps of:

inserting in the host instrument an external storage medium for storing an ID number inherent to the package, the package is provided with an optical transmission and reception terminal at one end and an electric signal transmission and reception terminal at another end;

collating the ID number with key verification information which is stored in the package or the host instrument; and permitting transmission of information only when the external storage medium is allowable.

* * * * *